(12) United States Patent
Burke et al.

(10) Patent No.: US 6,987,059 B1
(45) Date of Patent: Jan. 17, 2006

(54) METHOD AND STRUCTURE FOR CREATING ULTRA LOW RESISTANCE DAMASCENE COPPER WIRING

(75) Inventors: Peter A. Burke, Portland, OR (US); Hongqiang Lu, Lake Oswego, OR (US); Sey-Shing Sun, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/641,768

(22) Filed: Aug. 14, 2003

(51) Int. Cl.
*H01L 21/4763* (2006.01)

(52) U.S. Cl. ............... 438/627; 438/643; 438/687

(58) Field of Classification Search ........... 438/625, 438/627, 637, 642, 643, 687
See application file for complete search history.

(56) References Cited

U.S. PATENT DOCUMENTS 6,555,461 B1 * 4/2003 Woo et al. .............. 438/622
6,706,629 B1 * 3/2004 Lin et al. ................ 438/687
2002/0060363 A1 * 5/2002 Xi et al. .................. 257/751
2004/0130035 A1 * 7/2004 Wu et al. ................ 257/774

OTHER PUBLICATIONS

"Dual-Damascene: Overcoming Process Issues", DeJule, Semiconductor International, Reed Electronics Group, Jun. 1, 2000.

* cited by examiner

*Primary Examiner*—Christian D. Wilson
(74) *Attorney, Agent, or Firm*—Beyer Weaver & Thomas, LLP

(57) ABSTRACT

A low resistance copper damascene interconnect structure is formed by providing a thin dielectric film such as SiC or SiOC formed on the sidewalls of the via and trench structures to function as a copper diffusion barrier layer. The dielectric copper diffusion barrier formed on the bottom of the trench structure is removed by anisotropic etching to expose patterned metal areas. The residual dielectric thus forms a dielectric diffusion barrier film on the sidewalls of the structure, and coupled with the metal diffusion barrier subsequently formed in the trench, creates a copper diffusion barrier to protect the bulk dielectric from copper leakage.

17 Claims, 2 Drawing Sheets

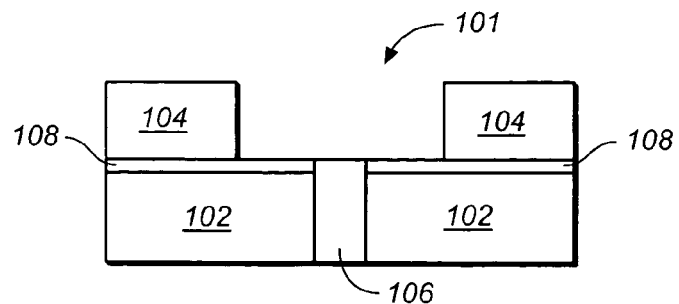
FIG._1A
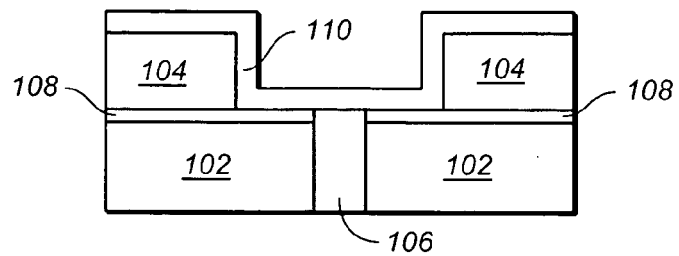
FIG._1B
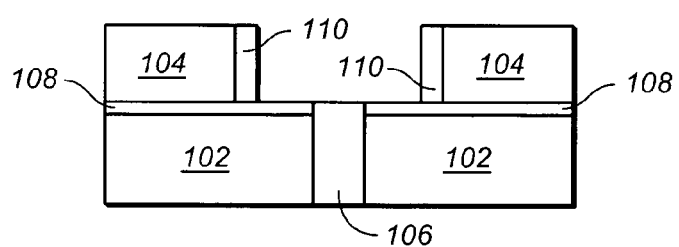
FIG._1C
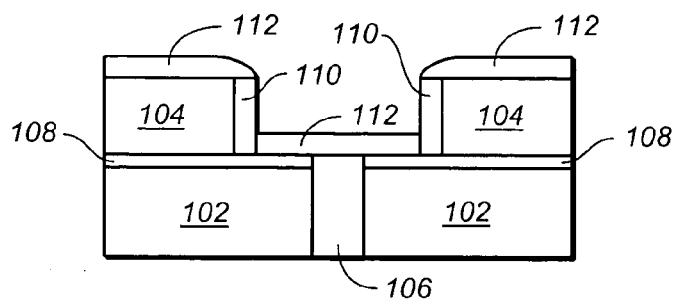
FIG._1D
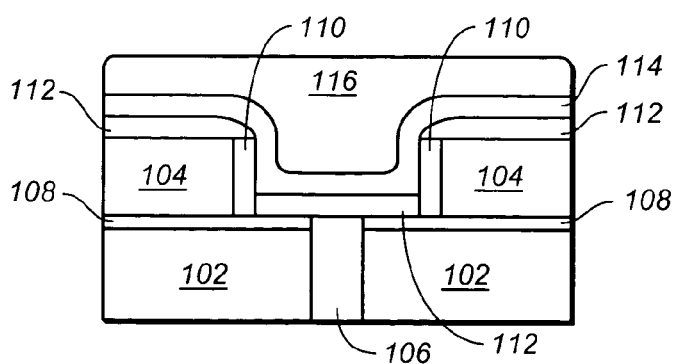
FIG._1E

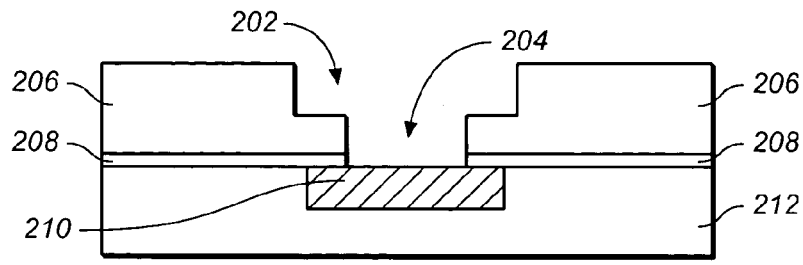
FIG._2A
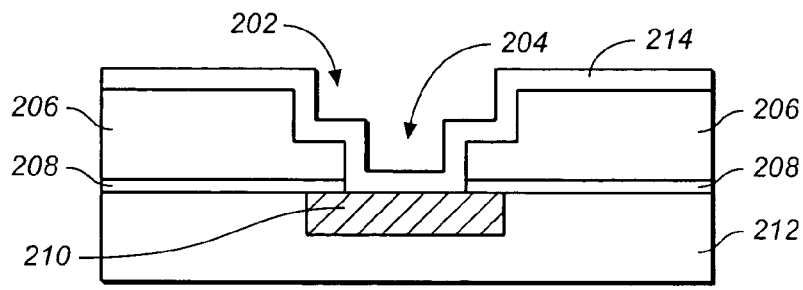
FIG._2B
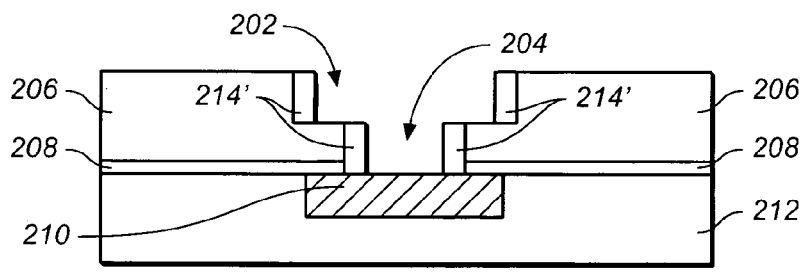
FIG._2C
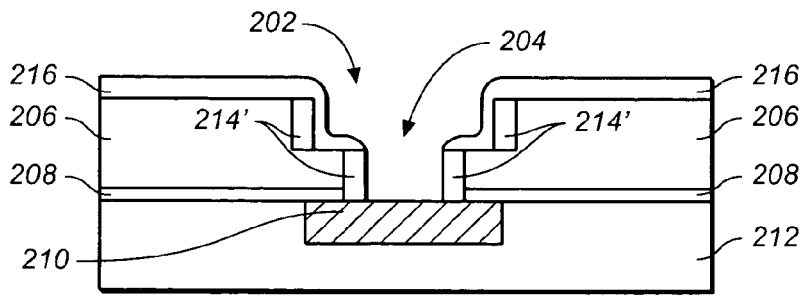
FIG._2D
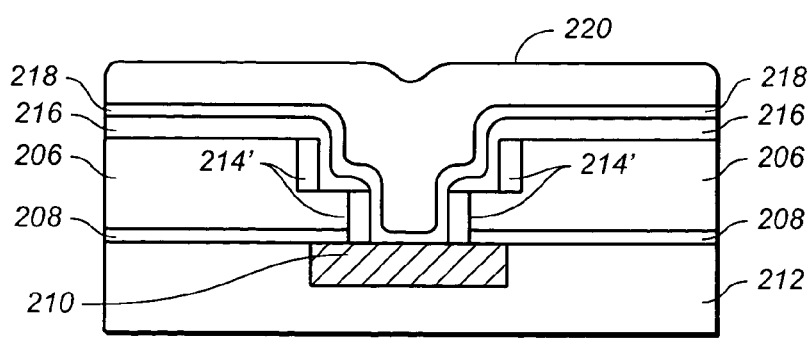
FIG._2E

METHOD AND STRUCTURE FOR CREATING ULTRA LOW RESISTANCE DAMASCENE COPPER WIRING

BACKGROUND OF THE INVENTION

1. Field of the Invention

The present invention relates to the formation of metal interconnects on semiconductor wafers. More particularly, the present invention relates to the formation of low resistance damascene copper interconnects.

2. Description of the Related Art

As integrated circuit devices grow smaller and smaller, higher conductance and lower capacitance is required of the interconnecting wires (i.e., interconnects). In order to accommodate these objectives, the trend has been towards the use of copper for interconnects and damascene methods for forming the interconnects. One drawback to the use of copper in the interconnects is its tendency to diffuse (i.e., leakage) into adjacent dielectric layers. Copper diffuses easily into dielectric layers and diminishes the electrical insulation qualities of the dielectric.

Copper diffusion barrier layers, for example layers containing tantalum, have been deposited before the deposition of copper to prevent "leakage". This barrier layer must be able to prevent diffusion, exhibit low film resistivity, have good adhesion to dielectric and Cu and must also be compatible with chemical mechanical polishing processes. Also the layer must be conformal and continuous to fully encapsulate Cu lines with as thin a layer as possible. Due to the higher resistivity of the diffusion barrier materials, the thickness should be minimized for Cu to occupy the maximum cross-sectional area.

In the copper/low-k damascene process for backend interconnect fabrication, TaN (or TiN) is typically used as a copper diffusion barrier to prevent copper diffusion into the Inter-Metal Dielectric (IMD) layer. TaN has a much higher resistivity compared to Cu (~250$\mu$ ohms/square and <2$\mu$ ohms/square for TaN and Cu respectively). Even with shrinking feature sizes, a minimal thickness of the metallic copper diffusion barrier is required to prevent diffusion of the copper into the surrounding dielectric regions. Hence, as the geometry of the via and trench size continue to shrink, the fraction of TaN resistance to the overall resistance increases. This is especially a matter of concern for the formation of vias as the resistance of the copper diffusion barrier layer contributes a large fraction of the overall resistance due to the smaller cross section of the via as compared to the trenches. This causes undesirable via and metal line resistance increases. Moreover, the interface between the TaN and Cu at the bottom and top of via structures is a weak point in Electromigration (EM) defect testing.

Failures due to electromigration are a major reliability concern for the use of copper in forming interconnects. Electromigration is the current induced diffusion of atoms due to the momentum transfer from moving atoms. Electromigration may result in voiding and thus open circuit failures. When these voids coincide with the interfaces at the top and bottom of the vias with surrounding interconnect lines, for example between the vias and bottom metal interface, the via connection fails or becomes highly resistive. The presence of thick copper diffusion barrier layers adds to this failure process by increasing current crowding and stress, and reducing critical void volume needed to cause via open.

Accordingly, what is needed is an improved process for forming damascene copper wiring in such a manner so as to minimize overall via and metal line resistance increases.

SUMMARY OF THE INVENTION

To achieve the foregoing, the present invention provides methods and structures for forming low resistance damascene copper wiring using simple and available process techniques. The processing steps applied in the embodiments of the present invention may be used to form a unique wiring structure that is better scaleable to met further copper wiring needs as the geometries used in integrated circuits continue to decrease.

A thin dielectric copper diffusion barrier such as, for example, SiC or SiOC is formed on the sidewalls of the via and trench structures. The dielectric layer on the bottom of the trench structure is removed by anisotropic etching to expose patterned metal areas. The dielectric thus forms a dielectric diffusion barrier film on the sidewalls of the structure, and coupled with the metal diffusion barrier subsequently deposited into the trench, creates a combined diffusion barrier to protect the bulk dielectric.

According to one embodiment of the present invention, a channel or trench is formed in a first dielectric layer of a substrate. A dielectric diffusion barrier film is then deposited in the channel to prevent the diffusion of a conductive interconnect metal layer into the first dielectric layer. The dielectric diffusion barrier barrier film is then etched anistropically to remove the dielectric diffusion barrier from the bottom surface of the channel to expose patterned metals. A barrier metal film is then deposited to cover the exposed bottom of the trench. The channel is then filled with a conductive interconnect metal layer.

According to another embodiment of the present invention, a via is attached to the trench in a dual damascene interconnect structure.

These and other features and advantages of the present invention are described below with reference to the drawings.

BRIEF DESCRIPTION OF THE DRAWINGS

Further advantages of the invention maybe obtained by reference to the detailed description together with the figures. The figures provided are not to scale so as to more clearly show details of the invention. Like reference numbers indicate like elements throughout the several views.

FIGS. 1A–E are diagrammatic cross-sectional views illustrating stages in the process of forming a single damascene metal interconnect structure in accordance with one embodiment of the present invention.

FIGS. 2A–2E are diagrammatic cross-sectional views illustrating stages in the process of forming a dual damascene metal interconnect structure in accordance with one embodiment of the present invention.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides a thin dielectric film such as SiC or SiOC formed on the sidewalls of via and/or trench structures to function as a copper diffusion barrier layer. The dielectric copper diffusion barrier formed on the bottom and top of the trench structure is removed by anisotropic etching to expose patterned metal areas. The residual dielectric thus forms "spacers" on the sidewalls of the structure which function as a dielectric diffusion barrier film, and coupled with the metal diffusion barrier subsequently formed in the trench, creates a continuous copper diffusion barrier to protect the bulk dielectric from copper leakage.

It is common for an integrated circuit to include multiple interconnect layers to connect the various devices on the integrated circuit. After each metal layer is deposited, a series or network of metal interconnect lines (wires) is formed in the metal layer. A preferable method of patterning the metal layers involves damascene techniques. Briefly, a network of grooves or channels is formed in the dielectric layer. A conductive metal is then deposited in the grooves. A subsequent polishing operation such as chemical mechanical polishing (CMP) forms a planarized surface on the dielectric layer and reduces the top level of the metal lines to the planarized surface of the dielectric.

In dual-damascene processes, both metal lines (i.e., formed in trenches) and metal vias are formed by cutting into dielectric layers and then filled the cuts with the conductive metal. That is, in order to create the metal lines, trenches or channels are cut into the dielectric, to be later filled with an inlaid metal such as copper. Also, circular channels (i.e., holes or vias) are cut (typically by etching) to connect one layer of metal to the overlying or underlying metal layer or transistor contact. In this process, the trenches for the metal lines and the vias connecting one layer of metal lines (wires) to another are filled in the same step. The resulting interconnect layer thus includes a metal line overlying a via for connecting the metal line to an underlying transistor contact or interconnect layer, preferably a metal line or stacked via in the interconnect layer.

FIGS. 1A–E are diagrammatic cross-sectional views illustrating stages in the process of forming a single damascene metal interconnect structure in accordance with one embodiment of the present invention. The features and dimensions of structures have been exaggerated for purposes of discussion and illustration and accordingly are not to scale.

As illustrated in FIG. 1A, the process commences with the formation of the trench 101 for a single damascene wiring. The trench 101 is formed in accordance with conventional methods in dielectric layer 104 which is positioned above tungsten contact 106 inlaid in dielectric layer 102. As feature sizes decrease, the materials of choice for these dielectric layers are typically low-k dielectrics. The dielectric layers 102, 104, preferably low-k layers, may be formed by various methods known to those of skill in the art, including a PECVD process, a spin-on process, and a flow-fill process. The low-k dielectric layer may be SiCOH or some other dielectric composition formed using silicon, carbon, oxygen and hydrogen, such as are known in the art. Low-k materials exhibit increased porosity in comparison to conventional silicon oxide dielectric layers. Such low-k dielectric materials may exhibit k values of 2.8 or lower (compared to conventional dielectrics (e.g. $SiO_2$) which exhibit k values of about 4.0 or more). Bulk dielectric materials including SiOC type films such as Black Diamond from Applied Materials are preferably used. Although a preference has been described for low-k layers, the invention is not so limited. The techniques and structures of the present invention may be used with any bulk dielectric layers including $SiO_2$.

Tungsten contact 106 is shown inlaid in the first dielectric layer 102 and an etch stop layer 108 deposited on the first dielectric layer 102 as further illustrated in FIG. 1A. The tungsten contact is formed by conventional lithography, etching, fill, and planarization methods and thus further description here is deemed unnecessary. The etch stop layer 108 is preferably selective to the low-k dielectric material used in the bulk dielectric 104. Etch stop layers preferably include SiC films, such as LSI's modified blok film based upon Applied Material's Blok film. The second low-k dielectric layer 104 is then deposited on the tungsten contact 106 formed in the first dielectric layer 102. Using a sequence of lithography, dry etch, resist strip and cleans in accordance with conventional techniques, the trench 101 is then formed.

Next, as illustrated in FIG. 1B, a dielectric copper diffusion barrier layer 110 is deposited on the structure. Dielectric copper diffusion barriers include conformal SiC films deposited by any of a number of suitable methods including chemical vapor deposition (CVD), plasma enhanced chemical vapor deposition (PECVD), metal organic chemical vapor deposition (MOCVD) and atomic layer deposition (ALD). Preferably, the dielectric diffusion barrier layer later will have a thickness in the range from 15 to 500 Angstroms, more preferably 50 to 100 Angstroms. The dielectric copper diffusion barrier may be formed from any material suitable for preventing the diffusion of copper into an adjacent dielectric layer. For example, SiC and SiOC, are expected to work well. Preferably, the dielectric copper diffusion barrier is one of SiC, SiOC, SiN, BN, AlN and amorphous carbon. These examples are intended to be illustrative and not limiting. The scope of the invention is intended to extend to all dielectric materials which restrict the diffusion of copper into adjacent bulk dielectric layers.

According to alternative embodiments of the present invention, surface treatments may be used to form the dielectric copper diffusion barrier layer. For example, high density plasma bombardment may be used to direct Ar or $H_2$ particles to the bulk dielectric to form the copper diffusion barrier.

Next, as illustrated in FIG. 1C, the dielectric copper diffusion barrier layer 110 is etched anisotropically so as to remove the dielectric barrier material on the bottom and top of the trench structure exposing patterned areas of metal below. That is, the dielectric diffusion barrier material is removed to expose the top surface of the tungsten contact 106. This operation acts to create a "spacer" of dielectric diffusion barrier film within the damascene structure formed in the preceding step. Suitable anisotropic etching techniques are known to those of skill in the relevant art and include, for example, plasma etching. Preferably a timed etch is used although other endpoint detection means known to those of skill in the relevant art may be used.

Next, as illustrated in FIG. 1D, the barrier metal layer 112 is deposited to prevent copper diffusion into the bulk dielectric 102. Barrier metals include refractory metals that are efficient copper diffusion barriers. Examples include Ta/TaN stacks and are preferably formed using ionized metal plasma (IMP) methods or high power self-ionized plasma (SIP) methods, with both methods benefiting from the use of a biased substrate, to obtain a highly directional deposition. The barrier metal layers may also be formed by PVD and IPVD methods. The objective of this step is to form a metallic copper diffusion barrier on the bottom of the trench 101 having sufficient thickness to prevent diffusion of the copper bulk filled in subsequent steps into the dielectric 102. The various embodiments of the present invention are particularly adapted to fulfill this objective.

Preferably, the deposition of the barrier metal 112 into the trench 101 is controlled to intentionally create poor sidewall coverage. This objective is easily attained using the techniques disclosed herein. The goal of this step is to deposit the barrier metal primarily on the bottom of the trench area to act as a barrier against copper diffusion into the bulk dielectric. By applying this barrier metal to this area, previously exposed in the etching step, the entire surface of the damascene channel (i.e., the trench) is coated with either a dielectric or a metallic copper diffusion barrier (110 or 112). Preferably, the metallic diffusion barrier layer will have a thickness at the bottom of the trench in the range from 0 to 200 Angstroms, preferably form 10–100 Angstroms. By using the directional deposition techniques as described in embodiments of the present invention, the "overdepositing" required in the forming of barrier metals in accordance with conventional techniques may be avoided. That is, using conventional techniques, in order to ensure a minimum layer of barrier metal over all surfaces of the trench, it has been necessary to target a much thicker layer. As feature sizes decrease, it is becoming even more challenging to deposit a uniform layer of barrier metal. For example, in forming device features at the 0.13 micron level, conventional barrier metal deposition techniques may require targeting a layer 100 Angstroms in thickness to ensure a minimum coverage of 10 Angstroms on the sidewalls of the trench. By using the dielectric copper diffusion spacers as described above, the subsequent barrier metal step is less critical. The thickness of the barrier metal formed on the sidewalls of the trench 101 may thus be minimized.

With this configuration a continuous copper diffusion barrier is formed on the surfaces of the channel (e.g., trench or via). The copper diffusion barrier formed on the trench sidewalls will be primarily if not completely a dielectric. On the bottom of the trench, the barrier is a barrier metal. In the case of a dual damascene structure, such as illustrated in FIGS. 2A–E described in further detail below, the presence of the dielectric diffusion barrier and the presence of a metal line or contact at the bottom of the via obviates the need for the barrier metal deposition process to provide coverage for either the via sidewalls or bottom of the via. However, small amounts of barrier metal deposition may be desirable on the trench and via sidewalls to help establish a desired copper grain structure. This thickness need not be sufficient to act as a diffusion barrier.

Next, as illustrated in FIG. 1E, a copper seed layer 114 is deposited. Deposition of the copper seed layer 114 may be implemented by any of a number of suitable process techniques. For example, physical vapor deposition (PVD), self ionized plasma type sputtering (SIP-PVD), IPVD, atomic layer deposition (ALD), chemical vapor deposition (CVD), and plasma-enhanced chemical vapor deposition (PECVD) are all suitable methods. According to one alternative embodiment, the seed can also be doped such as to aid in the film resistance to electromigration. For example, the seed layer may preferably be doped by Mg doping.

According to one alternative embodiment of the invention, an optional adhesion promoter may be deposited to facilitate the subsequent copper seed deposition steps. Materials and techniques for depositing adhesion promoters are known to those of skill in the art and therefore further explanation is deemed unnecessary here. This step can also be combined with anisotropic etching step described above to form an adhesion promoter on the exposed surfaces of the dielectric "spacers", i.e., the residual portions of the dielectric copper diffusion barrier after etching.

According to standard processing techniques, the via and trench will typically then be filled with copper by electrochemical deposition or electroplating, as illustrated in FIG. 1E, to form copper interconnect 116. Chemical mechanical polishing or other known planarization methods are then performed to complete the single damascene interconnect structure.

The preferred embodiment of this invention uses conventional materials and methods in each of the steps. For example, bulk dielectric materials include SiOC type films such as Black Diamond from Applied Materials of Santa Clara, Calif. Suitable etch stop layers include SiC films, such as LSI's modified blok film based upon Applied Material's Blok film. Barrier metals include refractory metals that are efficient copper diffusion barriers such as Ta/TaN stacks using IMP methods or SIP methods, with both methods benefiting from the use of a biased substrate, to obtain a highly directional deposition. Conventional Copper Seed methods as applied to the formation of the interconnect structures of the present invention include ALD and SIP type sputtering.

FIGS. 2A–2E are diagrammatic cross-sectional views illustrating stages in the process of forming a dual damascene metal interconnect structure in accordance with another embodiment of the present invention. In this embodiment, a dielectric diffusion barrier layer is used in conjunction with a metal barrier layer to line the trench and via to prevent copper diffusion into the bulk dielectric. The process commences as illustrated in FIG. 2A with a channel comprising a trench 202 and via 204 formed in a dielectric layer 206. The dielectric layer 206 is formed on a dielectric layer 212 having a metal line or contact 210 formed surrounded by the dielectric 212. That is, the metal line 210 may be formed in dielectric 212 by damascene techniques or alternatively may be composed of a metal that may be suitably etched then surrounded by a dielectric layer. These examples are intended to be illustrative and are not intended to limit the types of interconnect layers upon which the trench and via may be formed.

As discussed above with respect to single damascene interconnect structures, low-k layers are finding greater prevalence in interconnect structures. The dielectric layers 206 and 212, preferably low-k layers, may be formed by various methods known to those of skill in the art, including a PECVD process, a spin-on process, and a flow-fill process. The low-k dielectric layer may be SiCOH or some other dielectric composition formed using silicon, carbon, oxygen and hydrogen, such as are known in the art.

The dielectric layer 206 is disposed above the first dielectric layer 212 having a metal interconnect line 210 formed in it with an etch stop layer 208 interposed between the two dielectric layers. The etch stop layer 208 is preferably selective to the low-k or other dielectric material used in the bulk dielectric layer 206. Preferable etch stop layers include SiC films, such as LSI Logic Corporation's (Milpitas, Calif.) modified Blok film based upon Applied Material's Blok film.

The trench 202 and via 204 of the above referenced structure may be formed by any suitable sequence of etching the dielectric layer 206. That is, instead of a via first technique, the damascene trench and vias may alternatively be formed by trench first or buried via techniques without departing from the spirit and scope of the present invention.

As illustrated in FIG. 2B, a conformal layer of dielectric diffusion barrier layer 214 is formed in the trench 202 and via 204. That is, the conformal layer preferably covers the sidewalls of the trench and via and is formed by suitable deposition techniques or alternatively surface treatments. Dielectric copper diffusion barriers include conformal SiC films deposited by any of a number of suitable methods including chemical vapor deposition (CVD), plasma enhanced chemical vapor deposition (PECVD), MOCVD and atomic layer deposition (ALD). Preferably, the dielectric diffusion barrier layer later will have a thickness in the range from 15 to 500 Angstroms, more preferably 50 to 100 Angstroms. The dielectric copper barrier may be formed from any material suitable for preventing the diffusion of copper into an adjacent dielectric layer. For example, SiC and SiOC, are expected to work well. Preferably, the dielectric copper diffusion barrier is one of SiC, SiOC, SiN, BN, AlN and amorphous carbon. That is, any of the materials described with respect to the dielectric copper diffusion barrier layer of the single damascene structure of FIG. 1B are also suitable for use in the dual damascene structure and method. These examples are intended to be illustrative and not limiting. The scope of the invention is intended to extend to all dielectric materials that restrict the diffusion of copper ions into adjacent bulk dielectric layers.

Preferably the dielectric diffusion barrier layer has a thickness of less than 500 Angstroms, more preferably between 15 and 500 Angstroms, and most preferably between 50 and 100 Angstroms.

As with the single damascene interconnect structure, and according to alternative embodiments of the present invention, surface treatments may be used to form the dielectric copper diffusion barrier layer. For example, high density plasma bombardment may be used to direct Ar or $H_2$ particles to the bulk dielectric to form the copper diffusion barrier.

Next, as illustrated in FIG. 2C, the dielectric diffusion barrier layer 214 is etched, preferably by anisotropic techniques, so that the dielectric diffusion barrier layer portions 214' remain on the sidewalls of the trench 202 and via 204. Anisotropic etching techniques are well known to those of skill in the relevant art and thus complete details are deemed unnecessary here. For example, plasma etching with suitable high and low voltage parameters may be employed to perform the etching and to provide the desired directionality of the etching. By using these techniques, the underlying copper metal line 210 at the bottom of the via may be exposed by the etch.

Next, as illustrated in FIG. 2D, a metal diffusion barrier layer (i.e., barrier metal) 216 is deposited into the trench-via structure. Preferably, the deposition parameters are selected so as to create poor sidewall coverage. That is, the deposition of the barrier metal is directed to the bottom of the trench 202 areas to act as a barrier against copper diffusion into the bulk dielectric 208. Barrier metals include refractory metals that are efficient copper diffusion barriers such as Ta/TaN stacks using ionized metal plasma (IMP) methods or high power self-ionized plasma (SIP) methods, with both methods benefiting from the use of a biased substrate, to obtain a highly directional deposition. The thickness of the metal diffusion barrier on the sidewalls of the trench 202 and via 204 may range from full thickness (i.e., equivalent to the thickness on the bottom of the trench and via) to a complete absence of the barrier metal on the sidewalls. Preferably the thickness of the barrier metal on the sidewalls is less than 20% of the thickness on the bottom of the trench, more preferably less than 10%. By minimizing the thickness of the barrier metal layer on the sidewalls, more of the cross section of the via is available for filling by the conductive metal, typically copper.

The presence of the dielectric diffusion barrier and the presence of a metal line or contact at the bottom of the via obviates the need for the barrier metal deposition process to provide coverage for either the via sidewalls or bottom of the via. However, small amounts of barrier metal deposition may be desirable on the trench and via sidewalls to help establish a desired copper grain structure. This thickness need not be sufficient to act as a diffusion barrier. For example, the barrier metal layer preferably has a thickness in the range from 10 to 100 Angstroms to act as a diffusion barrier, more preferably in the range from 20–100 Angstroms.

Next, after deposition of the barrier metal layer 216, a copper seed layer 218 is deposited. Deposition of the copper seed layer 218 as illustrated in FIG. 2E may be implemented by any of a number of suitable process techniques. For example, physical vapor deposition (PVD, self ionized plasma type sputtering (SIP-PVD), ionized physical vapor deposition (IPVD), atomic layer deposition (ALD), chemical vapor deposition (CVD), and plasma-enhanced chemical vapor deposition (PECVD) are all suitable methods. According to one alternative embodiment, the seed can also be doped such as to aid in the film resistance to electromigration. For example, the seed layer may preferably be doped by Mg doping.

According to one alternative embodiment of the invention, an optional adhesion promoter may be deposited to facilitate the subsequent copper seed deposition steps. Materials and techniques for depositing adhesion promoters are known to those of skill in the art and therefore further explanation is deemed unnecessary here. This step can also be combined with anisotropic etching step described above to form an adhesion promoter on the exposed surfaces of the dielectric "spacers", i.e., the residual portions of the dielectric copper diffusion barrier after etching.

According to standard processing techniques, the via and trench will typically then be filled with copper by electrochemical deposition or electroplating, as illustrated in FIG. 2E, to form copper interconnect 220. Chemical mechanical polishing or other known planarization methods are then performed to remove the excess copper and barrier metal and to complete the damascene interconnect structure. As known to those of skill in the art, integrated circuits commonly have multiple interconnect layers to connect the various devices included in the integrated circuits, as many as nine or more interconnect metal layers. Thus, the interconnect structures illustrated and described are intended to apply to any of the interconnect layers of the integrated circuit.

Although damascene structures are more commonly formed using via first methods, the invention is not so limited. The via first sequence is but one of several dual damascene approaches to connect one layer of metal to the overlying or underlying metal layer or transistor contact. The embodiments of the present invention are applicable to any dual damascene technique, such as are well known in the art. A review of dual damascene processing techniques in provided in the article "Dual Damascene: Overcoming process issues," Semiconductor International (June, 2000), incorporated by reference herein in its entirety. For example, two alternative dual damascene processes are "trench first" and a self-aligned process ("buried via"). The steps of the process described above are provided as an example. Given the guidance provided by these steps, one skilled in the relevant art could apply the steps to the various configurations described throughout the specification to form the structures using various damascene and dual damascene processes and thus the scope of the invention is not intended to be limited to the process steps described.

By using the interconnect structures and methods of the present invention, the impacts from the higher resistance of the metallic copper diffusion barriers may be minimized. This is particularly advantageous in vias, where the higher resistivities of barrier metals such as tantalum contribute significantly to the overall via resistance. Further, by using this method and structure, the need to deposit thicker barrier metal layers than necessary for diffusion protection may be avoided.

Although the foregoing invention has been described in some detail for purposes of clarity of understanding, it will be apparent that certain changes and modifications may be practiced within the scope of the appended claims. For example, the conductive metal used to fill the channels has been described as copper. The invention is intended to cover not only those interconnect structures and methods using copper but also other conductive metals such as silver (Ag) that can be used to fill damascene structures. Accordingly, the present embodiments are to be considered as illustrative and not restrictive, and the invention is not to be limited to the details given herein, but may be modified within the scope and equivalents of the appended claims.

What is claimed is:

1. A method of forming a damascene interconnect structure in a semiconductor integrated circuit, the method comprising:

forming a trench in a first dielectric layer on a substrate;

forming a dielectric diffusion barrier film in the trench for preventing the diffusion of a copper interconnect metal layer into the first dielectric layer;

etching the dielectric diffusion barrier film anisotropically to remove the dielectric barrier film from the bottom surface of the trench to expose patterned metal;

depositing a barrier metal film in the trench to cover at least a portion of the bottom surface exposed by etching, wherein the thickness of the barrier metal film formed on the sides of the trench is approximately 20 percent or less of the thickness of the barrier metal film formed at the bottom of the trench; and filling the trench with a copper interconnect metal layer.

2. The method of forming a damascene interconnect structure in a semiconductor integrated circuit as recited in claim 1, further comprising a via aligned with the trench before forming a dielectric diffusion barrier film in the trench and wherein forming the dielectric diffusion barrier film in the trench is formed substantially simultaneously with the formation of the dielectric diffusion barrier film in the via.

3. The method of forming a damascene interconnect structure in a semiconductor integrated circuit as recited in claim 1, wherein the dielectric copper diffusion barrier layer is formed by one of CVD, PECVD, MOCVD, and ALD methods.

4. The method of forming a damascene interconnect structure in a semiconductor integrated circuit as recited in claim 1, wherein the barrier metal film further covers the sides of the trench.

5. The method of forming a damascene interconnect structure in a semiconductor integrated circuit as recited in claim 1, wherein the wherein the thickness of the barrier metal film formed on the sides of the trench is approximately 10 percent or less of the thickness of the barrier metal film formed at the bottom of the trench.

6. The method of forming a damascene interconnect structure in a semiconductor integrated circuit as recited in claim 1, wherein the thickness of the barrier metal film formed on the bottom of the trench lies in the range of 10 to 100 Angstroms.

7. The method of forming a damascene interconnect structure in a semiconductor integrated circuit as recited in claim 1, wherein the thickness of the dielectric diffusion barrier film deposited lies in the range of 15 to 500 Angstroms.

8. The method of forming a damascene interconnect structure in a semiconductor integrated circuit as recited in claim 1, wherein the thickness of the dielectric diffusion barrier film lies in the range of 50 to 100 Angstroms.

9. The method of forming a damascene interconnect structure in a semiconductor integrated circuit as recited in claim 1, further comprising depositing a copper seed layer on the barrier metal layer prior to filling the trench with copper.

10. The method of forming a damascene interconnect structure in a semiconductor integrated circuit as recited in claim 9, wherein depositing a copper adhesion promoter occurs before depositing the copper seed layer.

11. The method of forming a damascene interconnect structure in a semiconductor integrated circuit as recited in claim 1, wherein the trench is continuously lined with at least one of the dielectric diffusion barrier film or metallic diffusion barrier layer.

12. The method of forming a damascene interconnect structure in a semiconductor integrated circuit as recited in claim 1, wherein the dielectric diffusion barrier film includes at least one of SiC, SiN, Boron Nitride, amorphous carbon, AlN and SiOC.

13. The method of forming a damascene interconnect structure in a semiconductor integrated circuit as recited in claim 1, wherein the dielectric diffusion barrier film is formed by surface treating the dielectric layer using high density plasma bombardment to direct Ar or $H_2$ particles in the dielectric layer.

14. The method of forming a damascene interconnect structure in a semiconductor integrated circuit as recited in claim 1, wherein the anisotropic etching of the diffusion barrier film is performed by a plasma etch.

15. The method of forming a damascene interconnect structure in a semiconductor integrated circuit as recited in claim 1, wherein the barrier metal deposition is controlled by a directional deposition of the barrier metal.

16. The method of forming a damascene interconnect structure in a semiconductor integrated circuit as recited in claim 15, wherein the directional deposition is performed using one of ionized metal plasma (IMP), high power self-ionized plasma (SIP), physical vapor deposition (PVD), and ionized physical vapor deposition (IPVD) methods.

17. The method of forming a damascene interconnect structure in a semiconductor integrated circuit as recited in claim 15, wherein the directional deposition is performed using one of ionized metal plasma (IMP), high power self-ionized plasma (SIP), and ionized physical vapor deposition (IPVD) methods.

* * * * *